United States Patent [19]

Heckaman et al.

[11] Patent Number: 4,890,195
[45] Date of Patent: Dec. 26, 1989

[54] REPLACEABLE MMIC CHIP CARRIER CAPTURED BY DIFFERENTIAL THERMAL EXPANSION BETWEEN CARRIER AND SUPPORT HOUSING

[75] Inventors: Douglas E. Heckaman, Indialantic; Gilbert R. Perkins; Roger H. Higman, both of Palm Bay, all of Fla.

[73] Assignee: Harris Corporation, Melbourne, Fla.

[21] Appl. No.: 153,050

[22] Filed: Feb. 8, 1988

[51] Int. Cl.$^4$ .......................... H05K 7/20; H05K 7/02
[52] U.S. Cl. ..................................... 361/386; 29/447; 165/80.3; 165/185; 174/16.3; 357/81; 361/388; 361/417; 361/419
[58] Field of Search ................. 165/185, 80.3; 357/74, 357/80, 81; 361/386–389, 417, 419–420; 29/447; 285/381; 403/273

[56] References Cited

U.S. PATENT DOCUMENTS

| | | | |
|---|---|---|---|
| 3,187,226 | 6/1965 | Kates | 361/388 |
| 4,695,810 | 9/1987 | Heckaman et al. | 333/1 |

FOREIGN PATENT DOCUMENTS 0872580 6/1961 United Kingdom ................ 285/381

Primary Examiner—Gregory D. Thompson
Attorney, Agent, or Firm—Antonelli, Terry & Wands

[57] ABSTRACT

A chip carrier assembly and support arrangement provides a thermally and conductively secure chip interface, and enables rapid insertion and removal of the carrier so that replacement or repair of MMIC components may be facilitated. The chip carrier, which contains one or more chip cavities, is cylindrically configured and made of a material that has a coefficient of thermal expansion that is relatively low compared to that of its surrounding housing, so that a substantially uniform radial compressive force, resulting from the difference in coefficients of thermal expansion of the housing and the carrier, acts uniformly between the cylindrical sidewall of the cylindrical slot in the housing and the cylindrical sidewall of the carrier, thereby securing the chip carrier to the housing and providing thermal and electrical continuity between the carrier and its support housing. With thermal control and electrical grounding accomplished at its cylindrical perimeter, the thickness of the chip carrier becomes non-critical and can be tailored for heat spreading and ease of fabrication.

26 Claims, 5 Drawing Sheets

REPLACEABLE MMIC CHIP CARRIER CAPTURED BY DIFFERENTIAL THERMAL EXPANSION BETWEEN CARRIER AND SUPPORT HOUSING

FIELD OF THE INVENTION

The present invention relates in general to the packaging of microwave integrated circuit components and is particularly directed to a scheme for thermally and conductively securing a monolithic microwave integrated circuit (MMIC) chip carrier to a support housing.

BACKGROUND OF THE INVENTION

Continuing improvements in microelectronics circuit design and fabrication have produced components of increased signal processing complexity and speed and which occupy a decreasing (higher circuit density) circuit packaging volume. Packaging and support structures for a variety of (low frequency) integrated circuit components have included the use of in-line packages in which a set of leads or pins that protrude from the sides of a plastic package engage conductive tracks on a printed wiring board. For high frequency (e.g. microwave) applications, the critical dimensional tolerances and heat transfer characteristics of the devices have not only prevented a practical packaging for the chips, but have resulted in the use of mounting mechanisms that make the chip carriers effectively non-replaceable once they have been affixed to a signal interface/support structure. For example, at frequencies below 20 GHz, it has been conventional practice to employ screw-down open chips or solder attached hermetic chips. At higher frequencies however, the dimensions of the attachment components constitute resonance anomalies, necessitating the use of high precision customized coupling schemes, such as direct die attachments, which effectively make the chips non-replaceable. (For illustrations of the current state of the art of microwave chip carrier packaging, attention may be directed to an article entitled "Microwave Chip Carrier For Monolithic Integrated Circuits" by D A. Koopman-Larson et al, GaAs IC Symposium, 1985, pp. 155–158 and an article entitled "A 30 GHz Monolithic Two Stage Low Noise Amplifier" by L. C. T. Liu et al, GaAs IC Symposium, 1985, pp. 7–10.)

SUMMARY OF THE INVENTION

In accordance with the present invention, the drawbacks of conventional chip carrier packaging and mounting structures are obviated by a chip carrier assembly and support arrangement that not only provides a thermally and conductively secure chip interface, but enables rapid insertion and removal of the carrier so that replacement or repair of MMIC components may be facilitated. To this end, the chip carrier itself is configured as a cylindrical or disc-shaped member which is made of a material (e.g. Kovar, molybdenum or copper-tungsten alloy) having a coefficient of thermal expansion that is relatively low compared to that of a housing (e.g. aluminum) in which the carrier is to be captured and retained. The housing contains a cylindrical depression or cavity the diameter of which is sized to correspond to that of the chip carrier. A radial compressive force, resulting from the difference in coefficients of thermal expansion of the housing and the carrier, and acting uniformly between the cylindrical sidewall of the cylindrical cavity in the housing and the cylindrical sidewall of the carrier, secures the chip carrier to the housing and ensures thermal and electrical continuity between the carrier and its support housing. With thermal control (heat sink) and electrical grounding accomplished at its cylindrical perimeter (without gaps or cracks in the microwave ground current path), the thickness of the chip carrier becomes non-critical and can be tailored for heat spreading and ease of fabrication.

Insertion and removal of the chip carrier with respect to the housing is accomplished by heating the structure, causing an increase in the diameter of the chip carrier-receiving cylindrical cavity relative to that of the chip carrier. A plurality of spaced-apart insertion tool-receiving holes also in the carrier permit the carrier to be easily extracted from and placed within such a thermally enlarged cavity by a manual or computer-controlled mechanism. The round geometry of the chip carrier and its receiving holes provides a low cost mechanism for achieving the precision required for differential expansion capturing of the chip carrier.

Preferably the RF interior of the chip carrier is a crossed slot cavity or contains an array of crossed slot cavities in which the MMIC chips and their I/O substrates are mounted. The crossed slot configuration allows access to all four sides of a MMIC chip for wire bonding, yet each side's wire is directed into its own isolated waveguide-below-cutoff channel containing microstrip transmission lines leading to the chip carrier edge to interface with external channelized transmission lines, e.g. coaxial lines, 'waffleline', 'channelline'. The natural resonant frequency of the central cavity formed by the crossed slots is somewhat lower that the individual slot cutoff frequencies. (The crossed slots have a design width that insures good electrical isolation by setting the cavity resonances above the frequency band of interest.)

An alternative to the crossed-slot configuration is to employ a substantially planar-surfaced chip carrier block or disc having a plurality of holes into which respective removable cylindrically shaped pins are inserted. Each respective pin has an enlarged diameter annular ring portion the bottom surface of which engages the top surface of the chip carrier, while a cover, having holes sized and positioned to correspond to the pins is affixed the top surface of the ring portions of the pins. The separation between the outer cylindrical sidewalls of the enlarged diameter annular ring portions of the pins effectively corresponds to the separation between the parallel sidewalls of the crossed slots of the crossed-slot embodiment of the invention so as to provide resonance protection. The holes are also used to hold the carrier during insertion, removal and microcircuit assembly and testing steps. This embodiment of the invention provides a flatter bonding surface and makes it easier to install flush mounted heat sink chips, as typically required for power IMPATT diodes, GUNN diodes and step recovery diodes.

A modification of this multiple hole/pin embodiment involves the use of a cover having a plurality of cylindrically shaped tab portions at locations that are aligned with the holes in the carrier block and which have a stepped cylindrical cross sections that fit within and engage the sidewalls of the holes in the carrier, so as to provide electrical continuity between the carrier and the cover.

DETAILED DESCRIPTION

Figure 1:
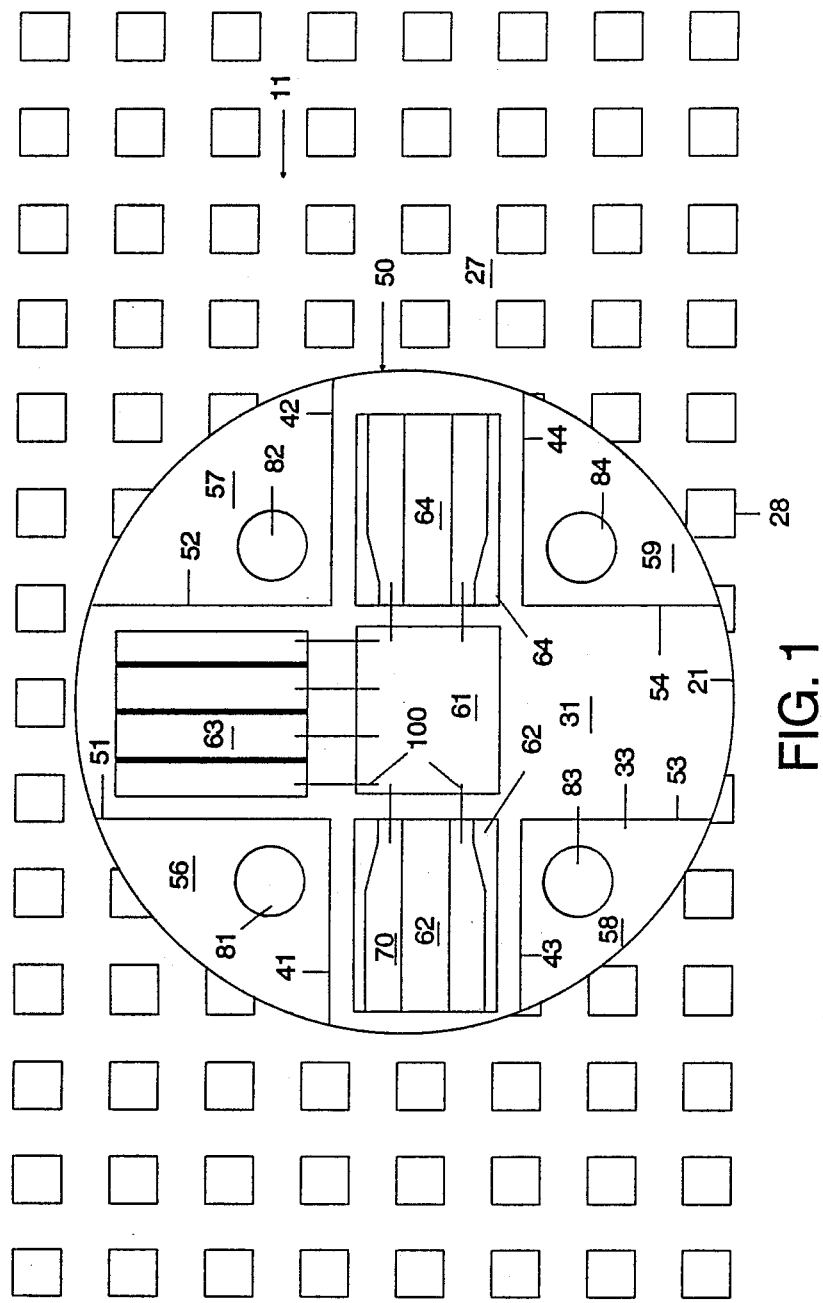
FIGS. 1 and 2 are respective diagrammatic plan and side views of a chip carrier and an associated cylindrically counter bored housing structure in which a chip carrier is retained in accordance with an embodiment of the present invention.
Figure 2:
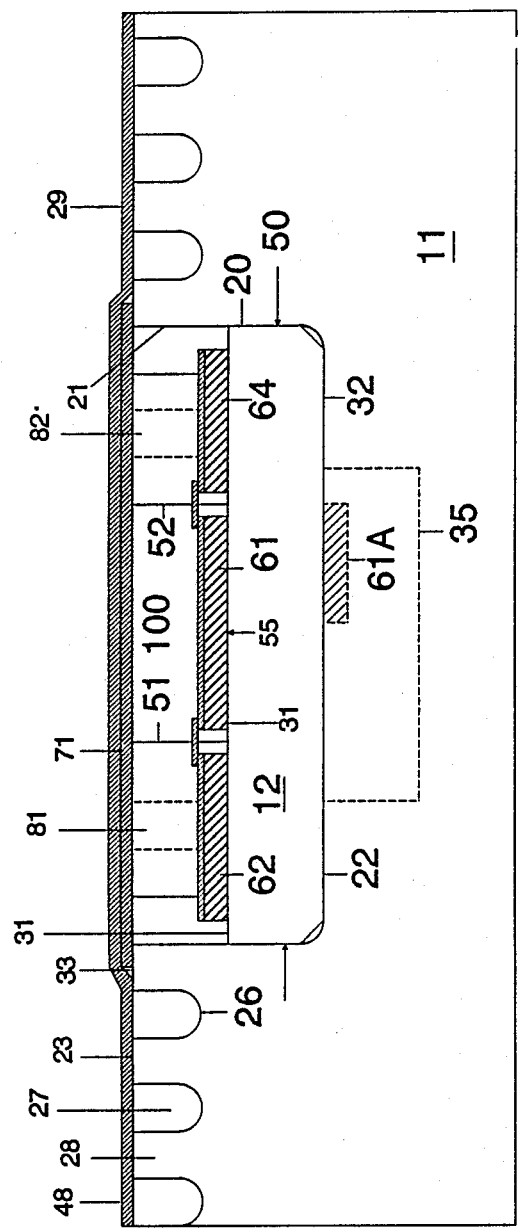

Referring now to FIGS. 1 and 2 of the Drawings, there are shown respective diagrammatic plan and side views of a monolithic microwave integrated circuit chip carrier and an associated support structure therefor in accordance with an embodiment of the present invention.

The support structure preferably comprises a thermally and electrically conductive plate member 11, capable of supporting a plurality of microwave transmission lines therethrough, which interface with the chip carrier. For this purpose, the support structure may comprise a 'waffleline' plate, such as described in U.S. Pat. No. 4,695,810, filed October 22, 1984 and issued on Sept. 22, 1987 to D. Heckaman et al, entitled "Waffleline Configured Microwave Transmission Link" and assigned to the Assignee of the present application. As described in that patent, a 'waffleline' plate may comprise an aluminum or aluminum alloy plate, having a thickness on the order of 0.25 inches to 0.05 inches and provided with a matrix of intersecting channels 27 through which an associated matrix of mesas 28 extending from a top surface 23 of the plate to floor portions (shown as cylindrical floor portions 26).

To accommodate a chip carrier, a chip carrier receiving portion, in the form of a cylindrical cavity (aperture or depression) 20, extends from the top surface 23 of the plate into a substantially planar floor portion 22 therebeneath. (Alternatively, depression 20 may extend completely through plate member 11, so as to permit insertion of the chip from below.) In terms of a practical embodiment, the depth of the floor portion 22 may extend on the order of 30 to 50 mils from the top surface 23 of the plate.

The chip carrrier itself is comprised of a cylindrically shaped disk member or block 12 having a diameter on the order of 0.18 to 0.35 inches and having a top planar surface 31 and a bottom planar surface 32. The outer cylindrical diameter of chip carrier 12 is slightly larger than the diameter of the interior cylindrical sidewall 21 of the chip receiving aperture 20 formed in plate member 11. The extent to which the diameter of cylindrical sidewall 21 of carrier 12 is larger than the inner diameter of carrier receiving aperture 20 of plate 11 will depend upon the normal operating temperature of the components and the materials of which the support plate 11 and the chip carrier 12 are made. With the support plate 11 being made of aluminum (having a CTE of $20 \times 10^{-6}$ PPM/°C., carrier 12 may be made of a material such as Kovar, molybdenum or copper-tungsten alloy, each of which has a CTE on the order of $4 \times 10^{-6}$ PPM/°C. at room temperature. The diameter differential between the carrier 12 and the aperture 20 in the plate 11, in order to function over an operating temperature range of $-55°$ C. to $125°$ C., should be on the order of 0.000 inches to 0.0010 inches. In general, the clearance requirement for any given carrier size at room temperature preferably corresponds to the diameter divided by a factor of 400, which yields a value to be subtracted from the outer diameter of the chip carrier 12 in order to decrease the inner diameter of the aperture 20. Within this operational range of temperatures, the higher coefficient of thermal expansion of the material (e.g. aluminum) of the support plate will cause a compressive force to be exerted in the direction of arrows 50 along the cylindrical sidewall of the chip carrier to retain the chip carrier in cavity 20.

The top surface of the chip carrier 12 is formed such that the chip carrier has a crossed slot configuration defined by sets of parallel sidewalls 41-42, 43-44 and 51-52, 53-54, as shown in FIG. 1. These sidewalls extend from the surface 31 to the top surface 33 to form a set of land portions or tabs 56-59 each of which is provided with a respective circular aperture or hole 81-84. The horizontal separation between the sidewalls 41-43, 42-44 and sidewalls 51-52, 53-54 is such as to prevent microwave/millimeter wave cavity resonance For a range of operating frequencies of 0-70 GHz, the separation between the sidewalls may be on the order of 0.062". (A 0.040" wide separation would give approximately 0-110 GHz useful range.)

A monolithic microwave integrated circuit chip, such as gallium arsenide chip 61, may be disposed on surface 31 in the central cavity portion 55 of the chip carrier, with respective I/O signal line and power conductor substrates 62, 63 and 64 being distributed around chip 61 between walls 41-43, walls 51-52 and walls 42-44, respectively, as shown. Interconnects between the chips and signal leads 70 are shown by way of wire bond interconnects 100.

It is also possible to distribute circuit components on both the top surface 31 and bottom surface 32 of the chip carrier, as illustrated in broken lines in FIG. 2. Here, the bottom surface of the chip carrier, upon which a circuit element 61A is mounted, faces a waveguide cavity 35 formed within support plate 11. Signal line connections to the bottom surface of carrier 12 are effected by way of pass-through links formed between the opposite sides of the carrier.

A top grounding layer 48, such as a conductive layer of aluminum or gold foil, may be formed over the top surface 33 of the land portions 56-59 of the carrier, extending to the waffleline mesas 28. For additional physical protection, a thin, rigid cover 71 may be bonded to plate 11 prior to application of grounding foil 29.

As pointed out previously, within the range of normal operating temperatures of the device, the outer diameter of chip carrier 12 is slightly larger than the diameter of the inner cylindrical sidewall 21 of aperture 20 in the support plate 11 within which the carrier 12 is placed, so as to ensure the continuous application of a radial compressive force between the interior cylindrical sidewall 21 of the support plate 11 and the cylindrical sidewall of the carrier 12.

To effect the insertion and retention of chip carrier 12 within the cylindrical aperture in the plate 11, the plate is heated by a thermostatically controlled hot plate to a temperature of 135° C. Because of the substantially greater coefficient of thermal expansion of the material (e.g. aluminum) of the support 11, the diameter of sidewall 21 of aperture 20 in plate 11 is enlarged relative to the outer diameter of carrier 12, so that the carrier may be placed into the cylindrical aperture or cavity 20. As pointed out previously, manipulation/placement of the carrier is preferably effected by a suitable gripping/handling tool which engages apertures 81–84 of the carrier. Once the carrier has been placed in the cavity and rests with its bottom surface 32 against the floor 22 of cavity 20, the structure is allowed to cool, causing the enlarged diameter of cavity 20 to contract around and apply a gripping compressive force in the radial direction against the cylindrical sidewall of the carrier 12. Because each of the cavity 20 of plate 11 and the sidewall 21 of the carrier 12 are cylindrically shaped, the radially directed compressive force is substantially uniformly distributed around the circumference of the carrier to ensure contiguous thermal and electrical engagement over all portions of the sidewall of the carrier and the aperture 20 within the plate 11. To remove the carrier, the procedure differs slightly. The waffleline plate 11 and the carrier 12 are heated to a temperature of 150° C so that diameter of the cavity will expand sufficiently to release the carrier. Since both the carrier 12 and plate 11 are heated, the temperature at which the cavity 20 releases the carrier 12 will be higher than the initial installation temperature.

Figure 3:
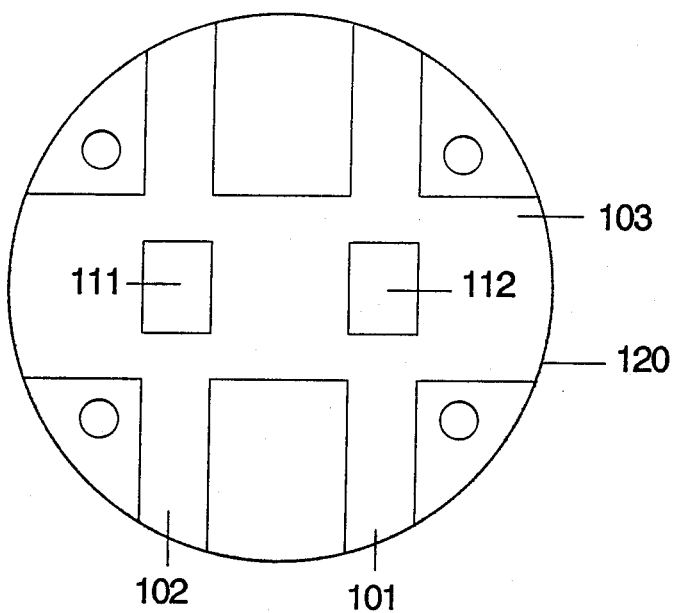
FIG. 3 illustrates an embodiment of the present in which the crossed slot configuration of the RF interior of the chip carrier contains an array of crossed slot cavities in which the MMIC chips and their I/O substrates are mounted.

As noted previously, the crossed slot configuration of the RF interior of the chip carrier may contain an array of crossed slot cavities in which the MMIC chips and their I/O substrates are mounted, as diagrammatically illustrated in FIG. 3. The slots 101, 102 and 103 shown therein may contain microstrip type wiring highways to interconnect between chips 111 and 112 and to interface with the external channelized interconnections at the chip carrier's edge 120. The crossed slot configuration allows access to all four sides of a MMIC chip for wire bonding, yet each side's wire is directed into its own isolated waveguide- below-cutoff channel containing microstrip transmission lines leading to the chip carrier edge to interface with external channelized transmission lines. The natural resonant frequency of the central cavity formed by the crossed slots is somewhat lower than the individual slot cutoff frequencies.

Figure 4:
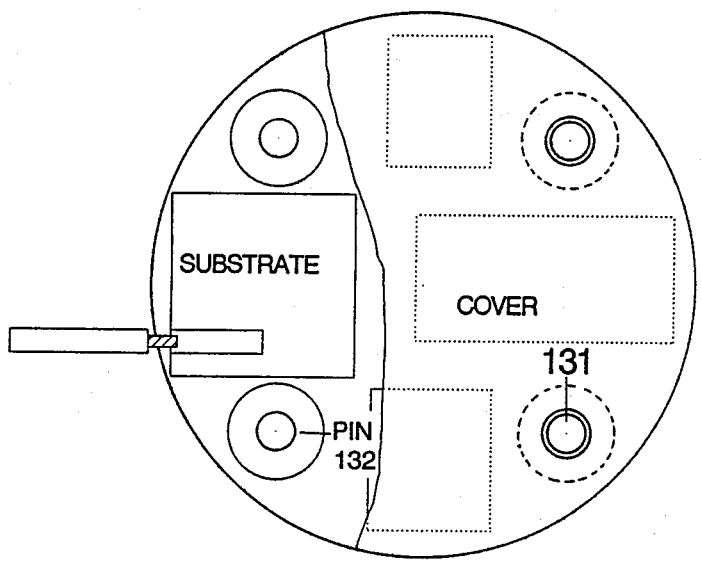
FIGS. 4 and 5 show a further embodiment of the invention in which the top surface of the chip carrier is planar and has a plurality of cylindrical holes into which respective pins are inserted.
Figure 5:
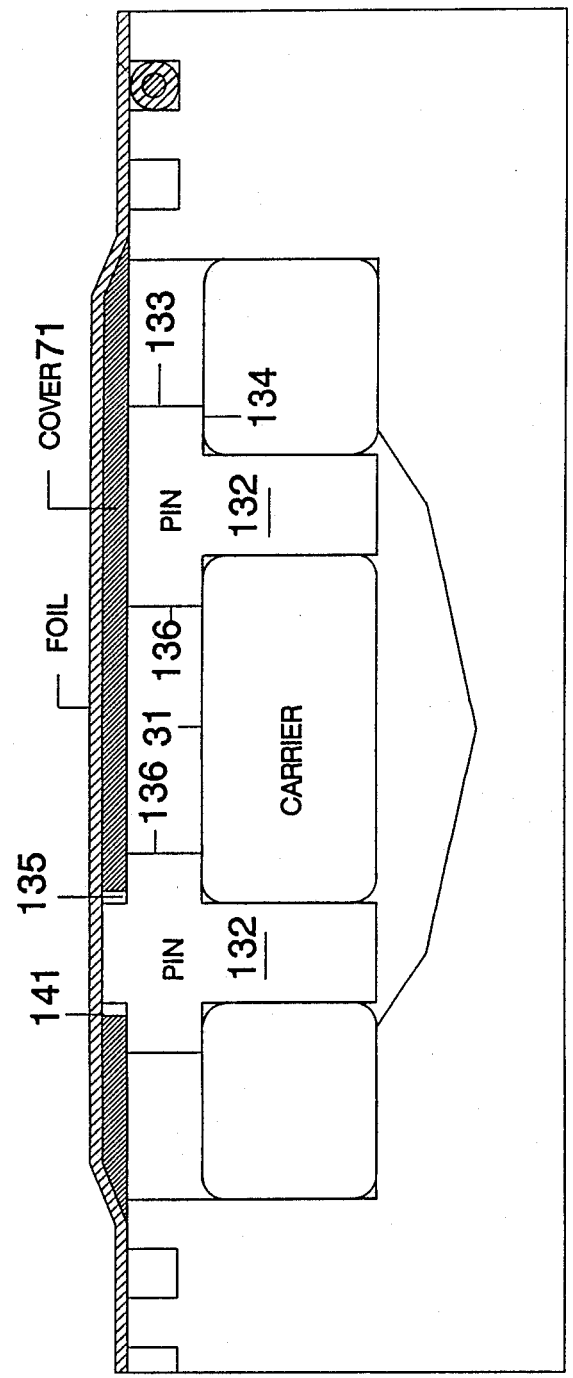

In the embodiments of the present invention shown in FIGS. 1-3, the chip carrier is disposed within a crossed slot pair having prescribed separations between the sidewalls to provide waveguide resonance cavity protection. In an alternative embodiment of the invention removable cylindrically shaped pins may be employed for this purpose. More particularly, as shown in FIGS. 4 and 5, the top surface of the chip carrier 12 is flat or planar and has a plurality (four shown in the Figures) of cylindrical apertures or holes 131 into which respective generally cylindrically shaped pins or posts 132 are inserted. Each respective pin 132 has an enlarged diameter annular ring portion 133 the bottom surface 134 of which engages the top surface 31 of the chip carrier 12, while cover 71 (having holes 141 sized and positioned to correspond to pins 132) engages (e.g. is welded to) the top surface 135 thereof. The separation between the outer cylindrical sidewalls 136 of the enlarged diameter annular ring portions 133 of the pins 132 effectively corresponds to the separation between the parallel sidewalls of the crossed slots of the embodiment of the invention shown in FIGS. 1 and 2 so as to provide resonance protection. In addition to securing pins 132 in position in carrier 12, holes 131 are also used to hold the carrier during insertion, removal and microcircuit assembly and testing steps.

An advantageous feature of the embodiment of the invention shown in FIGS. 4 and 5 is its ability to provide a flatter bonding surface and the fact that without the crossed slots it is easier to install (surface grinding and polishing is simplified) flush mounted (diamond) heat sink chips, as typically required for power IMPATT diodes, GUNN diodes and step recovery diodes.

Figure 6:
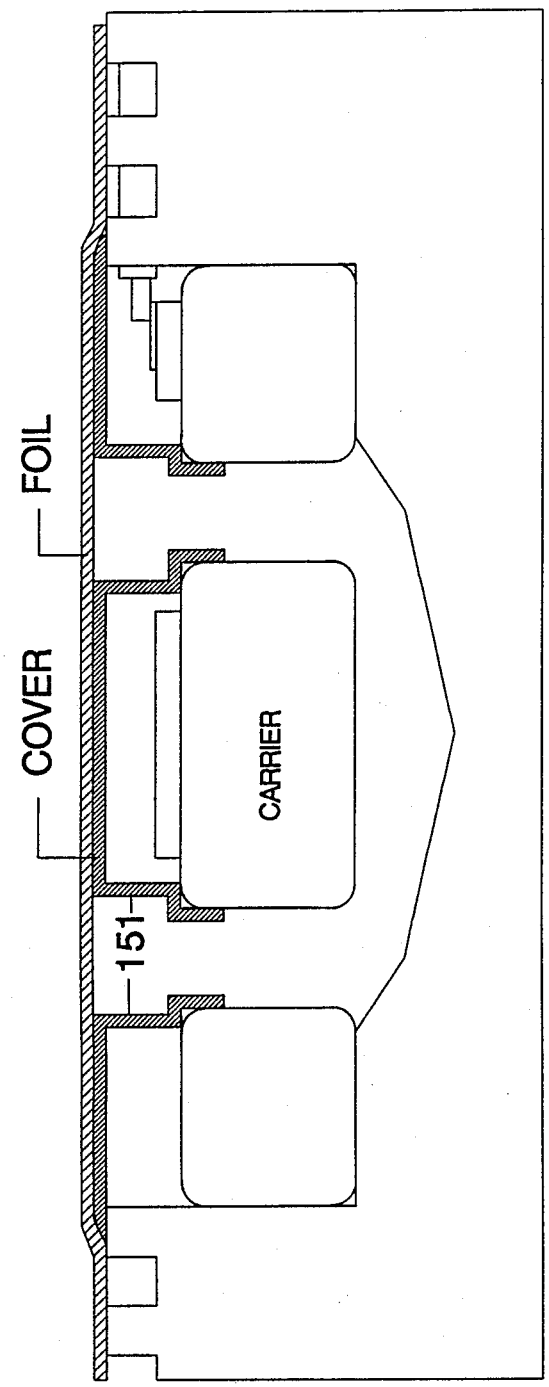
FIG. 6 shows a modification of the multiple hole/pin configuration of FIGS. 4 and 5 in which the pins have been replaced by cylindrically shaped tab portions that have been stamped into a carrier cover.

A modification of the multiple hole/pin configuration of FIGS. 4 and 5 is illustrated in FIG. 6 which shows a side sectional view of an embodiment of the carrier in which the pins have been replaced by cylindrically shaped tab portions 151 that have been stamped into cover 71 at locations that are aligned with holes 131 and which have a stepped cylindrical cross sections that fit within and engage the sidewalls of holes 131 in carrier 12, as shown, so as to provide electrical continuity between the carrier and the cover.

As will be appreciated from the foregoing description of the present invention, the drawbacks of conventional chip carrier packaging and mounting structures are overcome by a chip carrier assembly and support arrangement that not only provides a thermally and conductively secure chip interface, but enables rapid insertion and removal of the carrier so that replacement or repair of MMIC components may be facilitated. With the chip carrier being cylindrically configured and made of a material that has a coefficient of thermal expansion that is relatively low compared to that of its surrounding housing, a substantially uniform radial compressive force, resulting from the difference in coefficients of thermal expansion of the housing and the carrier, acts uniformly between the cylindrical sidewall of the cylindrical cavity in the housing and the cylindrical sidewall of the carrier, so as to secure the chip carrier to the housing and ensure thermal and electrical continuity between the carrier and its support housing. With thermal control and electrical grounding accomplished at its cylindrical perimeter, the thickness of the chip carrier becomes non-critical and can be tailored for heat spreading and ease of fabrication.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method for retaining a circuit component carrier within an electrically and thermally conductive support structure comprising the steps of:
    (a) configuring said support structure to have a circuit component carrier receiving portion which is sized to accept a circuit component carrier and which support structure contains thermally and electrically conductive material having a first coefficient of thermal expansion;
    (b) inserting a circuit component carrier containing electrically and thermally conductive material having a second coefficient of thermal expansion, different from said first coefficient of thermal expansion, into the circuit component carrier receiving portion of said support structure; and (c) applying a thermal input to said support structure, so as to cause said circuit component carrier receiving portion of said support structure to expand and accept insertion of said circuit component carrier and, in response to a reduction in the temperature of said support structure, to impart a compressive force against said circuit component carrier and retain said circuit component carrier in electrical and thermal communication with said support structure.

2. A method comprising to claim 1, wherein said first coefficient of thermal expansion has a value greater than said second coefficient of thermal expansion.

3. A method according to claim 2, wherein step (c) comprises the step of controllably increasing the temperature of said support structure. structure contains thermally and electrically conductive material.

4. A method according to claim 1, wherein said circuit component carrier has a cylindrically shaped perimeter portion and said circuit component carrier receiving portion of said support structure comprises a cylindrically shaped aperture into which said cylindrically shaped carrier may be inserted and retained by said compressive force.

5. A method according to claim 4, wherein said circuit component carrier comprises a cylindrically shaped metallic block supporting thereon at least one microwave integrated circuit chip, and said support structure comprises a metallic plate member having a cylindrically shaped aperture therein into which said cylindrically shaped metallic block is insertable so as to be in thermal and electrical communication with the cylindrical metallic sidewall of said aperture.

6. A method according to claim 5, wherein said cylindrically shaped metallic block has a crossed slot surface portion on which said at least one microwave integrated circuit chip is supported.

7. A method according to claim 6, wherein said crossed slot surface portion is dimensioned to allow access to the respective sides of said at least one microwave integrated circuit chip.

8. A method according to claim 7, wherein said crossed slots surface portion is comprised of a plurality of crossed slots forming a plurality of cavities at which respective microwave integrated circuit chips are supportable.

9. A method according to claim 6, wherein said first coefficient of thermal expansion has a value greater than said second coefficient of thermal expansion.

10. A method according to claim 9, wherein step (c) comprises the step of controllably increasing the temperature of said metallic plate member and inserting said metallic block into said aperture of said metallic plate member.

11. A method according to claim 5, wherein said cylindrically shaped metallic block has a substantially flat top surface containing a plurality of spaced-apart holes therein into which respective generally cylindrically shaped pins are inserted, the separation between said pins being such as to prevent resonance at the operational frequency of said at least one microwave circuit chip.

12. A method according to claim 11, further including the step of (d) attaching a conductive cover to said pins so as to enclose said at least one microwave circuit chip.

13. A method according to claim 5, wherein said cylindrically shaped metallic block contains a plurality of spaced-apart holes therein into which tab portions of a conductive cover are insertable and further including the step of attaching said cover to said metallic block by way of said tabs and said holes, the separation between said tabs being such as to prevent resonance at the operational frequency of said at least one microwave circuit chip.

14. A method according to claim 6, wherein said cylindrically shaped metallic block is configured to support, on opposite surfaces thereof, a plurality of microwave integrated circuit chips, and said support structure comprises a metallic plate member having a cylindrically shaped aperture therein into which said cylindrically shaped metallic block is insertable so as to be in thermal and electrical communication with the cylindrical metallic sidewall of said aperture, said metallic plate member having a cavity therein beneath said cylindrically shaped aperture so as to accommodate a microwave circuit chip supported on a bottom one of said opposite surfaces of said metallic block.

15. A packaging arrangement for a circuit component carrier comprising:
an electrically and thermally conductive support structure having a circuit component carrier receiving portion that is sizes to accept a circuit component carrier, said support structure containing material having a first coefficient of thermal expansion;
a circuit component carrier containing electrically thermally conductive material having a second coefficient of thermal expansion, different from said first coefficient of thermal expansion, inserted into the circuit component carrier receiving portion of said support structure and retained in electrical and thermal communication with said support structure by a compressive force acting against said circuit component carrier in response to the difference between said first and second coefficients of thermal expansion.

16. An arrangement according to claim 15, wherein said first coefficient of thermal expansion has a value greater than said second coefficient of thermal expansion.

17. An arrangement according to claim 15, wherein said circuit component carrier has a cylindrically shaped perimeter portion of said circuit component carrier receiving portion of said support structure comprises a cylindrically shaped aperture into which said cylindrically shaped carrier is inserted and retained by said compressive force.

18. An arrangement according to claim 17, wherein said circuit component carrier has a cylindrically shaped metallic block supporting thereon at least one microwave integrated circuit chip, and said support structure comprises a metallic plate member having a cylindrically shaped aperture therein into which said cylindrically shaped metallic block is insertable so as to be in thermal and electrical communication with the cylindrical metallic sidewall of said aperture.

19. An arrangement according to claim 18, wherein said cylindrically shaped metallic block has a crossed slot surface portion on which said at least one microwave integrated circuit chip is supported.

20. An arrangement according to claim 19, wherein said cylindrically shaped metallic block has a plurality of holes into which a gripping tool may be inserted for manipulating said block.

21. An arrangement according to claim 19, wherein said crossed slot surface portion is dimensioned to allow access to the respective sides of said at least one microwave integrated circuit chip.

22. An arrangement according to claim 21, wherein said crossed slot surface portion is comprised of a plurality of crossed slots forming a plurality of cavities at which respective microwave integrated circuit chips are supportable.

23. An arrangement according to claim 18, wherein said cylindrically shaped metallic block has a substantially flat top surface containing a plurality of spaced-apart holes therein into which respective generally cylindrically shaped pins are inserted, the separation between said pins being, such as to prevent resonance at the operational frequency of said at least one microwave circuit chip.

24. An arrangement according to claim 23, further including a conductive cover attached to said pins so as to enclose said at least one microwave circuit chip.

25. An arrangement according to claim 18, wherein said cylindrically shaped metallic block contains a plurality of spaced-apart holes therein into which tab portions of a conductive cover are inserted so as to attach said cover to said metallic block by way of said tabs and said holes, the separation between said tabs being such as to prevent resonance at the operational frequency of said at least one microwave circuit chip.

26. An arrangement according to claim 18, wherein said cylindrically shaped metallic block is configured to support, on opposite surfaces thereof, a plurality of microwave integrated circuit chips, and said support structure comprises a metallic plate member having a cylindrically shaped aperture therein into which said cylindrically shaped metallic block is insertable so as to be in thermal and electrical communication with the cylindrical metallic sidewall of said aperture, said metallic plate member having a cavity therein beneath said cylindrically shaped aperture so as to accommodate a microwave circuit chip supported on a a bottom one of said opposite surfaces of said metallic block.

* * * * *